(12) United States Patent
Tung et al.

(10) Patent No.: US 11,378,344 B2
(45) Date of Patent: Jul. 5, 2022

(54) IMMERSION COOLING SYSTEM

(71) Applicants: Inventec (Pudong) Technology Corporation, Shanghai (CN); INVENTEC CORPORATION, Taipei (TW)

(72) Inventors: Kai-Yang Tung, Taipei (TW); Hung-Ju Chen, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 70 days.

(21) Appl. No.: 16/902,687

(22) Filed: Jun. 16, 2020

(65) Prior Publication Data

US 2021/0285728 A1    Sep. 16, 2021

(30) Foreign Application Priority Data

Mar. 15, 2020    (CN) .......................... 202010178890.0

(51) Int. Cl.
*F28D 15/02* (2006.01)

(52) U.S. Cl.
CPC ........... *F28D 15/02* (2013.01); *F28D 15/025* (2013.01); *F28D 2015/0216* (2013.01)

(58) Field of Classification Search
CPC ........ F28D 15/02; F28D 15/025; F28D 15/04; F28D 15/043; F28D 2015/0216; H05K 7/203; H05K 7/20236; F01P 11/028; F01P 11/0285
See application file for complete search history.

(56) References Cited

U.S. PATENT DOCUMENTS

| 3,586,101 | A | * | 6/1971 | Chu | ...................... H01L 23/427 165/101 |
| 4,330,033 | A | * | 5/1982 | Okada | .................... F25B 23/006 165/104.27 |
| 5,113,927 | A | * | 5/1992 | Kedar | ....................... F28B 9/10 165/104.27 |
| 2015/0308750 | A1 | * | 10/2015 | Rice | .................... F28D 15/0266 165/104.26 |

* cited by examiner

*Primary Examiner* — Harry E Arant
(74) *Attorney, Agent, or Firm* — Locke Lord LLP; Tim Tingkang Xia, Esq.

(57) ABSTRACT

An immersion cooling system configured to store a coolant configured for cooling a heat source and including a liquid container, a tube and a gas regulating assembly. The liquid container is configured to store the coolant configured to cool the heat source. One end of the tube is connected to the liquid container. The gas regulating assembly is located above the tube and includes a valve, a cooler, and a gas container. The valve includes a first pipe, a second pipe and a third pipe. The valve is switchable to connect the first pipe to the second pipe or connect the first pipe to the third pipe. The first pipe of the valve is connected to the tube via the cooler. The second pipe is connected to ambient air, and the third pipe is connected to the gas container.

8 Claims, 6 Drawing Sheets

IMMERSION COOLING SYSTEM

CROSS-REFERENCE TO RELATED APPLICATIONS

This non-provisional application claims priority under 35 U.S.C. § 119(a) on Patent Application No(s). 202010178890.0 filed in China, on Mar. 15, 2020, the entire contents of which are hereby incorporated by reference.

BACKGROUND OF THE INVENTION

Technical Field of the Invention

The invention relates to a cooling system, more particularly to an immersion cooling system.

Description of the Related Art

Immersion cooling is a type of cooling technology that the heat source is immersed in non-conductive coolant to directly absorb the heat generated therefrom. During the cooling process, the heat is transferred to the liquid coolant and evaporates it to vapor and generates vapor bubbles rising to the liquid surface, and then the gaseous coolant is condensed and returns back to the liquid coolant.

A typical immersion cooling system requires a lid for the purpose of the maintenance of the internal components in the immersion tank. However, the lid is not airtight or perfectly sealed, and thus, during the operation, the gaseous coolant tends to escape from the gap between the lid and the tank due to the pressure difference between the high-pressure gaseous coolant and the ambient air. Regarding this issue, some additionally install a container on the system to temporarily store the gaseous coolant.

However, the volume of the container is too large in size and thus occupying too much internal space of the electronic apparatus where the immersion cooling system is installed and affecting and reducing the space supposed for other components in the apparatus. As a result, there may be no enough space left for the other required components of the electronic apparatus so that the electronic apparatus is unable to accommodate the number of components as many as expected in a limited space. Thus, it is desired to reduce the volume of the container to maintain a dense interior arrangement of the electronic apparatus.

SUMMARY OF THE INVENTION

One aspect of the invention is to provide an immersion cooling system capable of reducing the volume of the container to maintain a dense interior arrangement of the electronic apparatus.

Another aspect of the invention is to regulate the pressure of the immersion cooling system while providing a two-stage recycling of coolant and a configuration for reducing pressure so as to reduce the amount of the coolant lost during the process of reducing pressure.

Still another aspect of the invention is to enhance heat dissipation efficiency via the help of a cooling fin assembly or an active configuration for heat dissipation.

Still yet another aspect of the invention is to optimize the cooler to improve the efficiency for the coolant to be recycled.

One embodiment of this invention provides an immersion cooling system configured to store a coolant configured for cooling a heat source and including a liquid container, a tube and a gas regulating assembly. The liquid container is configured to store the coolant configured to cool the heat source. One end of the tube is connected to the liquid container. The gas regulating assembly is located above the tube and includes a valve, a cooler, and a gas container. The valve includes a first pipe, a second pipe and a third pipe. The valve is switchable to connect the first pipe to the second pipe or connect the first pipe to the third pipe. The first pipe of the valve is connected to the tube via the cooler. The second pipe is connected to ambient air, and the third pipe is connected to the gas container.

An embodiment of the invention provides a cooler comprising a plurality of cooling fins that are connected to the thermally conductive pipes so as to further enhance the heat dissipation efficiency of the cooler.

According to the immersion cooling systems discussed above, the valve is able to adjust the connection relationship among the first pipe, the second pipe, and the third pipe so as to dissipate the gaseous coolant to the ambient air or store/collect it to the gas container. As a result, the gas container is able to achieve the function of reducing the loss of gaseous coolant while having a smaller volume.

In addition, the cooler is disposed between the valve and the tube, and thus the cooler is able to condense the gaseous coolant into liquid so as to reduce the amount of the gaseous coolant escaping from the liquid container, thereby reducing the loss of the gaseous coolant during the beginning stage of evaporation.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
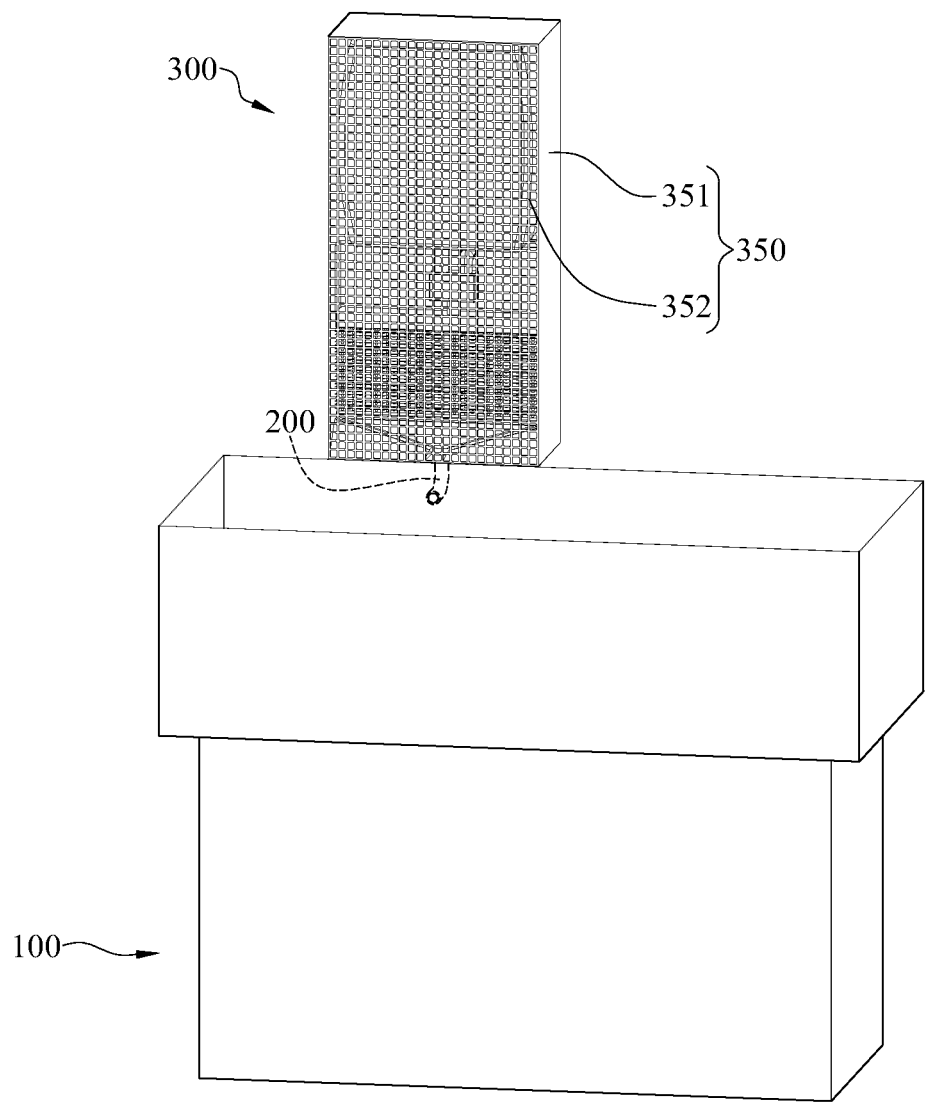
FIG. 1 is a perspective view of an immersion cooling system according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1, there is shown a perspective view of an immersion cooling system according to a first embodiment of the disclosure. This embodiment provides an immersion cooling system 10 configured to store a coolant (not shown), where the coolant is configured to cool a heat source (not shown). The heat source is, for example, a server or a host assembly. The coolant is, for example, non-conductive refrigerant. The immersion cooling system 10 includes a liquid container 100, a tube 200, and a gas regulating assembly 300. The liquid container 100 is configured to store a liquid coolant configured to cool the heat source. One end of the tube 200 is connected to the liquid container 100, and the other end of the tube 200 is connected to the gas regulating assembly 300.

Figure 2:
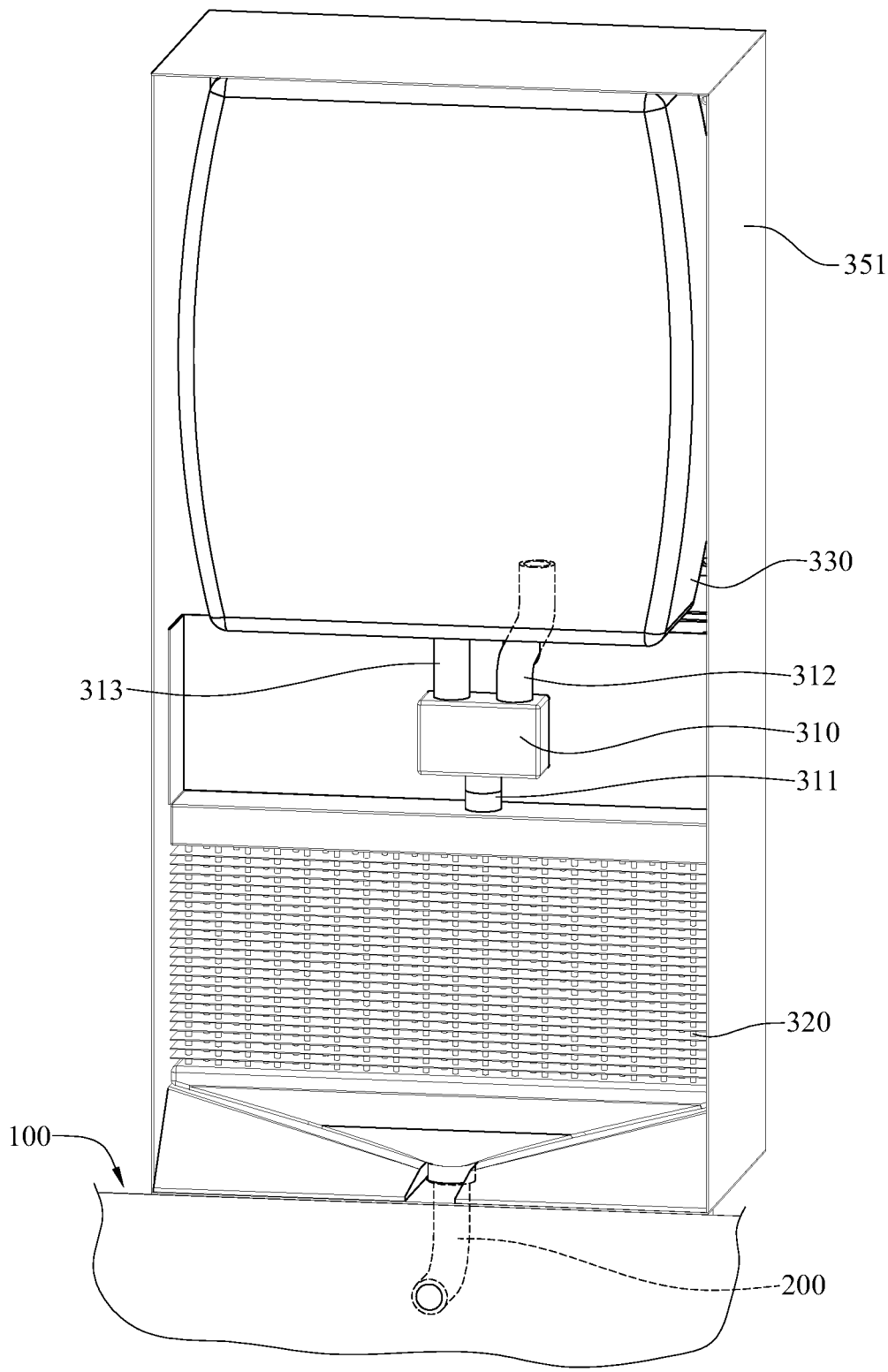
FIG. 2 is a partially enlarged view of the immersion cooling system in FIG. 1.
Figure 3:
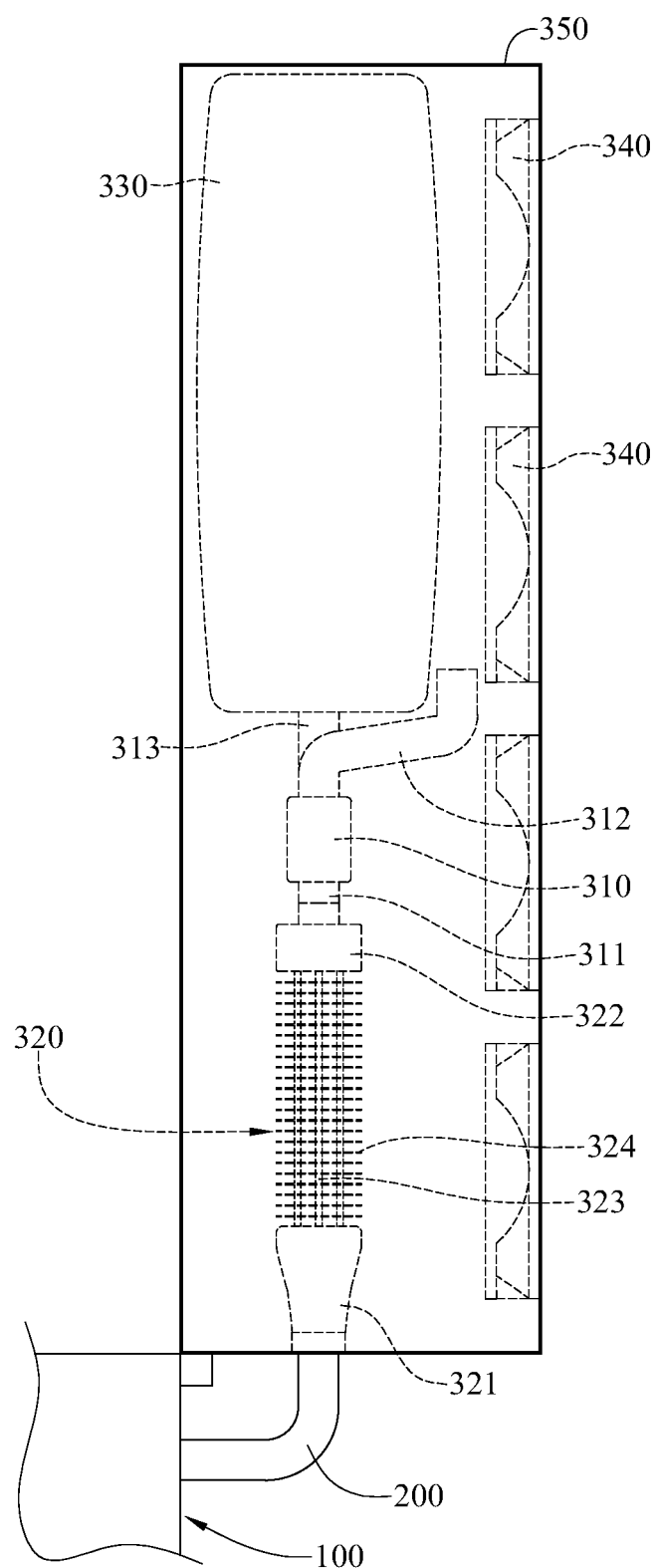
FIG. 3 is a partially enlarged side view of the immersion cooling system in FIG. 2.
Figure 4:
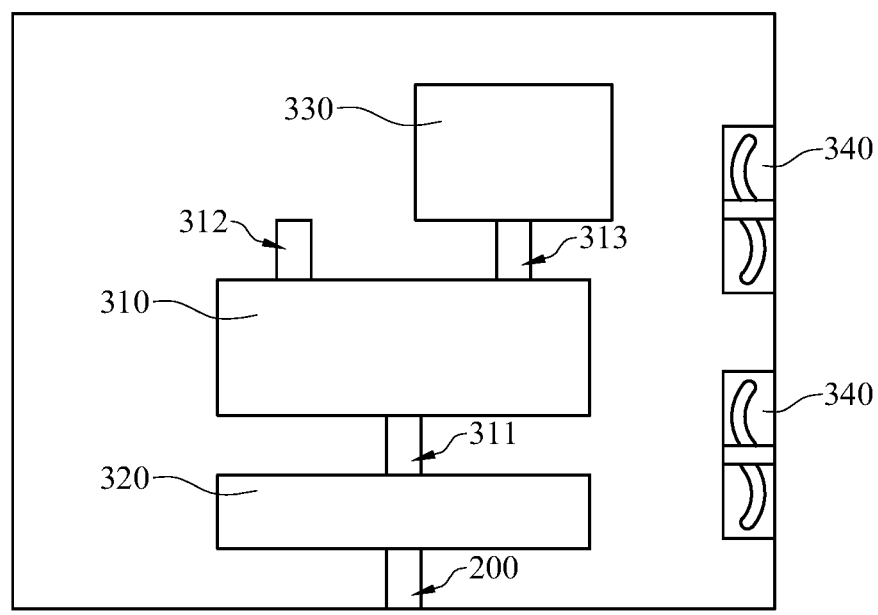
FIG. 4 is a simplified schematic view of the immersion cooling system in FIG. 2.

Please refer to FIG. 2 to FIG. 4, where FIG. 2 is a partially enlarged view of the immersion cooling system in FIG. 1, FIG. 3 is a partially enlarged side view of the immersion cooling system in FIG. 2, and FIG. 4 is a simplified schematic view of the immersion cooling system in FIG. 2. The gas regulating assembly 300 includes a valve 310, a cooler 320, and a gas container 330. The valve 310 includes a first pipe 311, a second pipe 312, and a third pipe 313. The first pipe 311 of the valve 310 is connected to the tube 200 via the cooler 320. The second pipe 312 is connected to the ambient air or the outside of the immersion cooling system 10. The third pipe 313 is connected to the gas container 330. In this embodiment, in standard usage, the gas container 330 is located higher than the valve 310, and the valve 310 is located higher than the cooler 320. In this arrangement, the condensed liquid in the gas container 330 can drop and flow to the valve 310 and then to the cooler 320 due to gravitational force.

The valve 310 is, for example, a solenoid valve, and is configured to selectively connect the first pipe 311 to the second pipe 312 or the third pipe 313 according to the electrical signal it receives. For example, when the first pipe 311 is disconnected from the second pipe 312 and connected to the third pipe 313 and the gas container 330, an electrical signal transmitted to the valve 310 can indicate it to switch status so as to disconnect the first pipe 311 from the third pipe 313 and connect the first pipe 311 to the second pipe 312 and the ambient air.

Further, while the liquid coolant in the liquid container 100 absorbs the heat generated by the heat source, the heat can evaporate the liquid coolant to gaseous coolant in form of bubbles rising to the liquid surface, the gaseous coolant will be mixed with the gas that was existing in the liquid container 100. At the beginning of the evaporation of the coolant, the liquid container 100 contains so little gaseous coolant so the valve 310 at this stage can be in a status to connect the first pipe 311 to the second pipe 312 and to disconnect the same from the third pipe 313, such that the liquid container 100 now is connected to the ambient air via the second pipe 312. In this stage, some of the gas existing in the liquid container 100 flows to the outside via natural convection. Then, after the evaporation process had been working for a while, the amount of the gaseous coolant in the liquid container 100 increases, and thus to prevent too much loss of coolant, the valve 310 will be switched so as to connect the first pipe 311 to the third pipe 313 and to disconnect the same from the second pipe 312. By doing so, the mixed gas in the liquid container 100 will be transferred into the gas container 330 via the third pipe 313. Also, the stored gaseous coolant will be condensed into liquid and flow back to the liquid container 100. Accordingly, it is understood that the gas container 330 does not need to store/collect the gas from the liquid container 100 during the preliminary stage of operation so that the volume of the gas container 330 can be designed to be smaller. As a result, the liquid container 330 will not occupy too much internal space of the electronic apparatus (e.g., server) where the immersion cooling system 10 is installed, such that the electronic apparatus is allowed to accommodate more components in a limited space, thereby achieving a dense interior arrangement of the electronic apparatus.

In addition, it is understood that the escaped gaseous coolant during the beginning stage of the evaporation is still a loss. Regarding this, in this embodiment, a cooler 320 is further provided between the valve 310 and the tube 200. The cooler 320 is able to condense the gaseous coolant into liquid so as to decrease the amount of the gaseous coolant escaping from the liquid container 100. That is, the cooler 320 is able to reduce the gaseous coolant existing in the liquid container 100 so as to reduce the loss of the gaseous coolant during the beginning stage of evaporation.

In this embodiment, the gas regulating assembly 300 may further include a plurality of fans 340 located on a side of the cooler 320. The fans 340 are configured to generate airflow to cool the cooler 320. In this embodiment, the fans 340 are, for example axial fans, but the invention is not limited thereto. In other embodiments, the fans may be centrifugal fans or air blowers.

Please refer to FIG. 1 and FIG. 3, the gas regulating assembly 300 may further include a casing 350. The casing 350 includes a casing body 351 and a lid 352. The lid 352 is used to cover the casing body 351 so that the valve 310, the cooler 320, the gas container 330, and the fans 340 are accommodated in the area surrounded by the lid 352 and the casing body 351.

Figure 5:
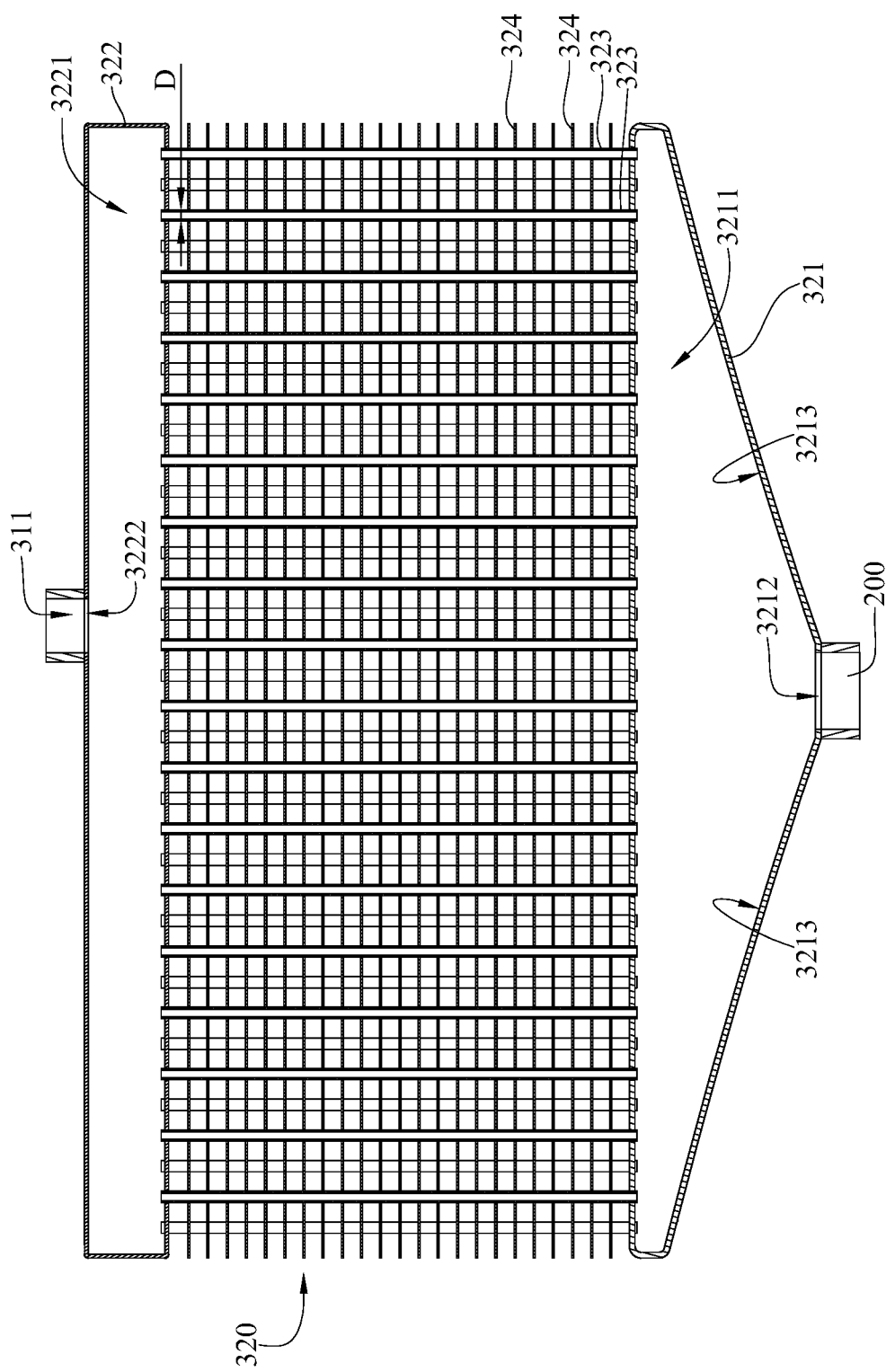
FIG. 5 is a cross-sectional view of a cooler in FIG. 2.

Please refer to FIG. 5, there is shown a cross-sectional view of a cooler in FIG. 2. The cooler 320 may further include a first thermally conductive casing 321, a second thermally conductive casing 322, and a plurality of thermally conductive pipes 323. The first thermally conductive casing 321 is connected to the tube 200, the second thermally conductive casing 322 is connected to the first pipe 311 of the valve 310, and two opposite ends of the thermally conductive pipe 323 are respectively connected to the first thermally conductive casing 321 and the second thermally conductive casing 322. In this embodiment, the first thermally conductive casing 321 includes a first internal space 3211, a first port 3212, and two inclined guide planes 3213. The first internal space 3211 is connected to the passage of the tube 200 via the first port 3212. The inclined guide planes 3213 are respectively connected to two opposite sides of the first port 3212, sides of the two inclined guide planes 3213 that are located closer to the first port 3212 are located lower than sides of the two inclined guide planes 3213 that are located away from the first port 3212. The second thermally conductive casing 322 includes a second internal space 3221 and a second port 3222. The second internal space 3221 is connected to the first internal space 3211 via the thermally conductive pipes 323, and is connected to the first pipe 311 via the second port 3222.

In this embodiment, the thermally conductive pipes 323 each have a cross-section in round shape and having an outer diameter D of ranging between, for example, 4 millimeters (mm) and 8 mm, and the outer diameter D is larger enough to not form a liquid membrane to disturb the flowing of fluid, but the invention is not limited thereto; in other embodiments, as long as the liquid membrane will not be formed in the channel, the outer diameter D of the thermally conductive pipes 323 may be smaller than 4 mm or larger than 8 mm.

In this embodiment, the thermally conductive pipe 323 is a straight pipe, as shown, the thermally conductive pipe 323 extends in a straight line from the first thermally conductive casing 321 towards the second thermally conductive casing 322 and has no bend portion thereon. This configuration of the thermally conductive pipe 323 allows the condensed liquid in the gas container 330 to flow straight down to the liquid container 100.

In this embodiment, there may be a capillary structure arranged in the thermally conductive pipes 323 to facilitate the flowing of the liquid coolant. The capillary structure may be in one form of having, for example, groove-like structure, mesh-like structure, fiber-like structure, or sintered-like structure.

In this embodiment, the cooler 320 further includes a plurality of cooling fins 324 connected to the thermally conductive pipes 323 to further enhance the heat dissipation efficiency of the cooler 320.

Figure 6:
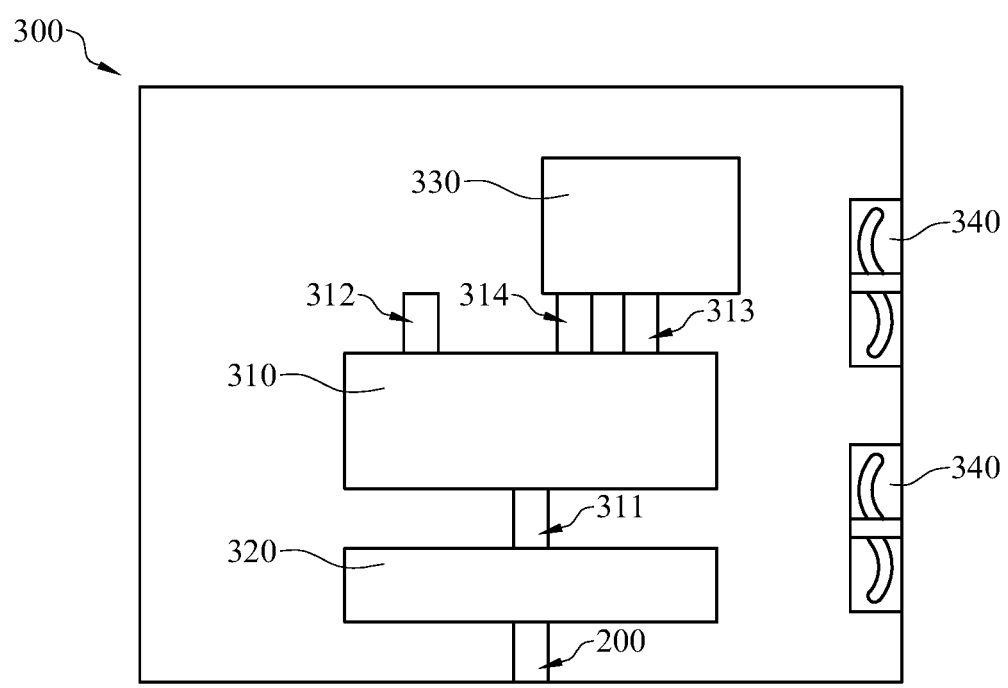
FIG. 6 is a simplified schematic view of an immersion cooling system according to a second embodiment of the disclosure.

Please refer to FIG. 6, there is shown a simplified schematic view of an immersion cooling system according to a second embodiment of the disclosure. In this embodiment, the gas regulating assembly 300 further includes a fourth pipe 314 connected to the gas container 330. The valve 310 is able to connect the fourth pipe 314 to the second pipe. When the pressure in the gas container 330 exceeds a threshold value, the valve 310 is able to connect the fourth pipe 314 to the second pipe 312. At least part of gaseous coolant in the gas container 330 is dissipated into the ambient air via the valve 310.

According to the immersion cooling systems discussed above, the valve is able to adjust the connection relationship among the first pipe, the second pipe, and the third pipe so as to dissipate the gaseous coolant to the ambient air or store/collect it to the gas container. As a result, the gas container is able to achieve the function of reducing the loss of gaseous coolant while having a smaller volume.

In addition, the cooler is disposed between the valve and the tube, and thus the cooler is able to condense the gaseous coolant into liquid so as to reduce the amount of the gaseous coolant escaping from the liquid container, thereby reducing the loss of the gaseous coolant during the beginning stage of evaporation.

The aforementioned embodiments according to the invention can be applied to various forms of the electronic computer architecture, such as internet communication device, industrial computer, server or peripheral devices thereof, and they also can further be applied to artificial intelligence (AI) computing, edge computing, cloud computing server, cloud storage server, 5G server or internet of vehicle server.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. An immersion cooling system, configured to store a coolant configured for cooling a heat source, the immersion cooling system comprising:
   a liquid container, configured to store the coolant configured to cool the heat source;
   a tube, wherein one end of the tube is connected to the liquid container; and
   a gas regulating assembly, comprising a casing, the gas regulating assembly located above the tube and further comprising a valve, a cooler, and a gas container, wherein the valve comprises a first pipe, a second pipe and a third pipe, the valve is switchable to connect the first pipe to the second pipe or connect the first pipe to the third pipe, the first pipe of the valve is connected to the tube via the cooler, the second pipe is connected to ambient air, and the third pipe is connected to the gas container;
   wherein the gas container is located higher than the valve, and the valve is located higher than the cooler;
   wherein the valve is directly connected to the first pipe, the second pipe and the third pipe.

2. The immersion cooling system according to claim 1, wherein the cooler comprises a first thermally conductive casing, a second thermally conductive casing and a plurality of thermally conductive pipes, the first thermally conductive casing is connected to the tube, the second thermally conductive casing is connected to the first pipe of the valve, two opposite ends of each of the plurality of thermally conductive pipes are respectively connected to the first thermally conductive casing and the second thermally conductive casing.

3. The immersion cooling system according to claim 2, wherein the plurality of thermally conductive pipes are straight pipes.

4. The immersion cooling system according to claim 2, wherein the first thermally conductive casing comprises a first internal space, a first port and two inclined guide planes, the first internal space is connected to a passage of the tube via the first port, the two inclined guide planes are respectively located on two opposite sides of the first port, and sides of the two inclined guide planes that are located closer to the first port is located lower than the sides of the two inclined guide planes that are located away from the first port.

5. The immersion cooling system according to claim 1, wherein when the valve is switchable to connect the first pipe to the third pipe and to disconnect the first pipe from the second pipe, a part of the coolant in the liquid container is evaporated and is transferred into the gas regulating assembly via the tube; at least part of the coolant that is evaporated is condensed in the cooler of the gas regulating assembly; at least part of the coolant that is evaporated is transferred into the gas container of the gas regulating assembly via the valve, and the coolant that is condensed in the cooler flows back to the liquid container via the tube.

6. The immersion cooling system according to claim 5, wherein at least part of the coolant that is evaporated is transferred into the gas container of the gas regulating assembly via the valve and is condensed, and the coolant that is condensed and located in the gas container is transferred into the cooler via the valve.

7. The immersion cooling system according to claim 1, wherein the gas regulating assembly further comprises a fourth pipe, the fourth pipe is connected to the gas container, the valve is switchable to further connect the fourth pipe and the second pipe, when the valve is switched to connect the fourth pipe and the second pipe, at least part of the coolant that is evaporated and located in the gas container is dissipated to the air via the second pipe of the valve.

8. The immersion cooling system according to claim 1, wherein when the valve is switched to connect the first pipe to the second pipe and to disconnect the first pipe from the third pipe, a part of the coolant in the liquid container is evaporated and is transferred into the gas regulating assembly via the tube, at least part of the coolant that is evaporated is condensed in the cooler of the gas regulating assembly, at least part of the coolant that is evaporated is dissipated into the air via the valve, and the coolant that is condensed and located in the cooler flows back to the liquid container via the tube.

* * * * *